(12) United States Patent
Li

(10) Patent No.: US 7,298,297 B1
(45) Date of Patent: Nov. 20, 2007

(54) HARDWARE-IMPLEMENTED HUFFMAN DECODER

(75) Inventor: Shao-Lun Li, Kaohsiung (TW)

(73) Assignee: Mediatek Inc., Hsin-Chu (TW)

( * ) Notice: Subject to any disclaimer, the term of this patent is extended or adjusted under 35 U.S.C. 154(b) by 146 days.

(21) Appl. No.: 11/207,131

(22) Filed: Aug. 18, 2005

Related U.S. Application Data

(60) Provisional application No. 60/522,116, filed on Aug. 18, 2004, provisional application No. 60/522,128, filed on Aug. 18, 2004.

(51) Int. Cl.
*H03M 7/40* (2006.01)
(52) U.S. Cl. .............................. 341/65; 341/50; 341/51
(58) Field of Classification Search ................. 341/50, 341/512, 65
See application file for complete search history.

(56) References Cited

U.S. PATENT DOCUMENTS

| | | | | |
|---|---|---|---|---|
| 5,784,631 A * | 7/1998 | Wise | ........................... | 382/246 |
| 5,881,301 A * | 3/1999 | Robbins | ........................ | 712/1 |
| 5,965,741 A * | 10/1999 | Breault et al. | .............. | 548/252 |
| 6,435,737 B1 * | 8/2002 | Wise et al. | .................. | 712/200 |

* cited by examiner

*Primary Examiner*—Jean Bruner Jeanglaude
(74) *Attorney, Agent, or Firm*—Thomas, Kayden, Horstemeyer & Risley

(57) ABSTRACT

A hardware-implemented Huffman decoder converting Huffman-encoded data to raw data using logic gates to implement logic states. The logic states include IDLE, COEFF_READ, COEFF_WRITE, HUFF_ADDR_LOG, HUFF_ADDR_PHY, AMP_CAL, and EOB_RUN$_{13}$ GEN. IDLE state transfers to COEFF_READ or AMP_CAL states according to eob_run, ac_first_scan, and ss signals, COEFF_READ state transfers to HUFF_ADDR_LOG or AMP_CAL states according to ac_first_scan, ac_refine_scan, eob_run, new_ac_nonzero_coeff, and dc_refine_scan signals. COEFF_WRITE state transfers to AMP_CAL or COEFF_READ states according to ac_first_scan, coeff_index, zero_run, and eob_run signals. HUFF_ADDR_LOG state transfers to HUFF_ADDR_PHY state and HUFF_ADDR_PHY state transfers to AMP_CAL or EOB_RUN_GEN states according to ac_first_scan and ac_refine_scan signals. AMP_CAL state transfers to AMP_CAL, COEFF_WRITE, or HUFF_ADDR_LOG states according to dc_first_scan, dc_refine_scan, ac_first_scan, ac_refine_scan, coeff_index, zero_run, eob_run, new_ac_nonzero_coeff, se, and progr_coeff0_pool signals. EOB_RUN_GEN state transfer to AMP_CAL state.

19 Claims, 17 Drawing Sheets

HARDWARE-IMPLEMENTED HUFFMAN DECODER

CROSS REFERENCE APPLICATION

This application claims priority from U.S. Provisional Patent Application Ser. No. 60/522,116 No. and U.S. Provisional Patent Application Ser. No. 60/522,128 filed both on Aug. 18, 2004. Both the '116 and '128 applications are incorporated herein in its entirety.

BACKGROUND

The invention relates to image decoding, and in particular to methods and systems for decoding images conforming to JPEG format.

JPEG (Joint Photographic Experts Group) format is a popular static image compression technology. Currently, more than 90% of static image files conform to JPEG format.

JPEG format is commonly used as a file transfer format for multimedia communications. Generally, photos or images captured by digital cameras are pre-stored and then displayed or transmitted to computers for further editing process. Thus, a standard format, such as the JPEG format, which simultaneously compatible with the digital cameras and computers is required. Another reason for using the JPEG format is that JPEG image compression/encoding reduces huge storage requirement of image files. The memory-reduction feature is especially advantageous for specific application devices, such as mobile phones, digital cameras, or personal digital assistants (PDAs).

Two scan modes may be employed to JPEG images, baseline and progressive modes. An image can be divided into frames for encoding/decoding. While being scanned in baseline scan mode, an image frame is completely scanned at one time and all image information, such as hue values, is obtained from the onetime scan. While being scanned in progressive mode, the image frame is scanned repeatedly in each scan.

The baseline mode scan produces a simpler file structure that makes the corresponding JPEG decoder easier to implement. While presently JPEG decoders focus on baseline scan mode, JPEG decoders in progressive scan mode are however desirable in the future. Since the progressive mode produces a much more complex file structure, it raises a problem that the decoding speed by the traditional decoder becomes intolerably slow.

It is an important issue to have a better JPEG decoder for decoding JPEG images in either the baseline or progressive modes.

Huffman coding is an entropy encoding algorithm used for lossless data compression. The term "entropy encoding" refers to the use of a variable-length code table for encoding a source symbol where the variable-length code table has been derived based on the estimated probability of each possibly value of the source symbol. Huffman coding is currently used as compression method for multimedia coding, such as JEPG or MP3.

A JPEG image frame in progressive mode can be scanned by DC first scan, DC refine scan, AC first scan, or AC refine scan. If an image frame is scanned in DC scan, the scan contains only DCT (Discrete Cosine Transform) coefficient 0. If an image frame is scanned in AC scan, the scan contains no DCT coefficient 0. Additionally, a first scan means that a scan contains MSBs (most significant bits) of DCT coefficients and a refine scan means that a scan contains no MSBs of DCT coefficients. For progressive JPEG images, DC coefficients can be completely retrieved according to each DC first scan and DC refine scan. Similarly, AC coefficients can be fully regained according to each AC first scan and AC refine scan.

SUMMARY

An exemplary embodiment of a Huffman decoder uses logic gates to implement logic states. The logic states comprise IDLE, COEFF_READ, COEFF_WRITE, HUFF_ADDR_LOG, HUFF_PHY, AMP_CAL, and EOB_RUN_GEN states. IDLE state transfers to COEFF_READ or AMP_CAL state according to eob_run, ac_first_scan, and ss signals. COEFF_READ state transfer to HUFF_ADDR_LOG or AMP_CAL state according to ac_first_scan, ac_refine_scan, eob_run, new_ac_nonzero_coeff, and dc_refine_scan signals. COEFF_WRITE state transfers to AMP_CAL or COEFF_READ state according to ac_first_scan, coeff_index, zero_run, and eob_run signals. HUFF_ADDR_LOG state transfers to HUFF_ADDR_PHY state. HUFF_ADDR_PHY state transfers to AMP_CAL or EOB_RUN_GEN state according to ac_first_scan and ac_refine_scan signals. AMP_CAL state transfers to AMP_CAL, COEFF_WRITE, or HUFF_ADDR_LOG logic state according to dc_first_scan, dc_refine_scan, ac_first_scan, ac_refine_scan, coeff_index, zero_run, eob_run, new_ac_nonzero_coeff, se, and progr_coeff0_pool signals. EOB_RUN_GEN state transfers to AMP_CAL state.

DESCRIPTION OF THE DRAWINGS

The invention can be more fully understood by reading the subsequent detailed description and examples with references made to the accompanying drawings, wherein.

DESCRIPTION

Figure 1:
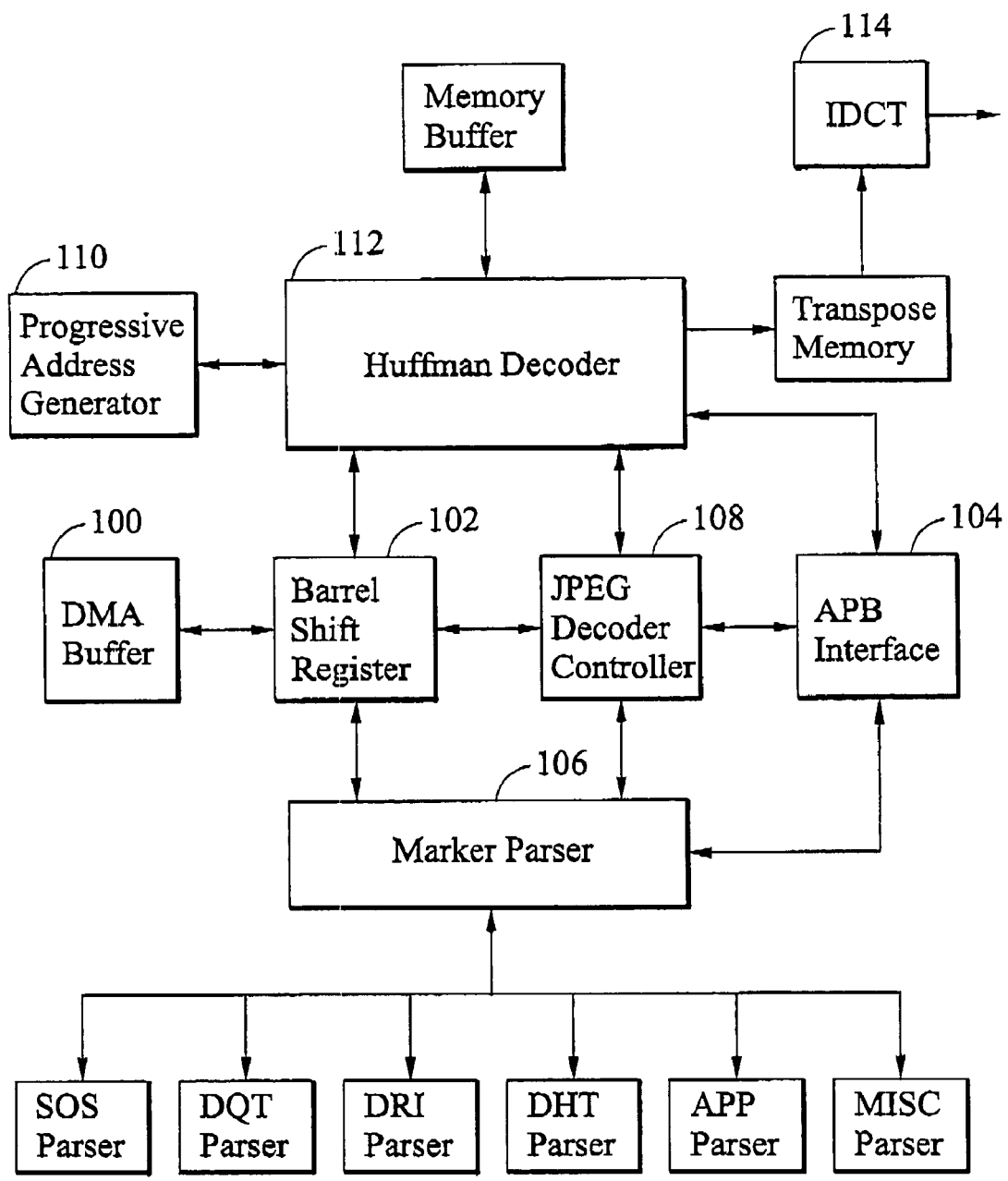
FIG. 1 is a diagram of an embodiment of a JPEG decoder in hardware.

FIG. 1 is a diagram of an embodiment of a JPEG decoder in hardware. The JPEG decoder comprises a DMA (Direct Memory Access) buffer 100, a barrel shift register 102, an APB interface 104, a market parser 106, a JPEG decoder controller 108, a progressive address generator 110, and a Huffman decoder 112.

The DMA buffer 100 is a direct memory access channel. The DMA buffer 100 receives an image frame in JPEG format, comprising a frame header and scan section, from a memory device through memory interface. The received data is then transmitted to the barrel shift register 102. The barrel shift register 102 provides data for the marker parser 106, the JPEG decoder controller 108, and the Huffman decoder 112.

The JPEG decoder controller 108 handles handshakes information between the marker parser 106 and the Huffman decoder 112. The marker parser 106 parses the header information from the frame header and scan header. The Huffman decoder 112 decodes information bits from the parsed data according to the address provided by the progressive address generator 110.

The marker Parser 106 also parses information from different headers, such as SOS (Start of Scan) headers, DHT (Define Huffman Table) headers, DQT (Define Quantization Table) headers, and DRI (Define Restart Interval) headers. Concretely, the marker parser 106 may activate one suitable header parser for header parse. In one embodiment, Huffman decoding-related tables, such as four quantization tables, four DC Huffman tables, and four AC Huffman tables, can be pre-stored in internal or external hardware devices coupled to the marker parser 106 for image decoding. The Huffman decoding-related tables could be generated by Huffman encoder. A Huffman decoder decodes data by referring to the stored tables.

If an image frame is scanned in progressive scan mode, each scan may include one to three data components and each component may include several 8×8 data units. The SOS header parser obtains data information, such as the number of data components contained in the current scan or data units of each data component in a minimum coding unit (MCU). The MCU comprises data components to express hue values of an image frame.

The Huffman decoder 112 converts Huffman-encoded data stream to raw data for Inverse Discrete Cosine Transform (IDCT) unit 114 to perform inverse discrete cosine transform. APB interface 104 is an interface of software programs transmitting decoding information. The Huffman decoder 112 may contain memory buffer 114 storing data for Huffman-encoded data decoding. When the Huffman decoder 112 or the marker parser 106 executes data decoding or data parsing, some decoding information may obtained from the APB interface 104. For example, some variables used for data decoding are calculated by software programs of the APB interface 104.

Due to the nature of progressive JPEG compression, the memory buffer 114 functions as a temporary buffer for storing the whole JPEG image, which is necessary for decoding a progressive JPEG image. Generally, the memory buffer 114 stores the intermediate, partially decoded coefficients. All coefficients must remain in the memory buffer 114 until all scans are processed.

The size of the memory buffer 114 is determined by the decoding image size. If the image size is W×H, the size of the memory buffer 114 will be W×E×$N_1$×$N_2$, where $N_1$ represents the number of the components in the decoding image and $N_2$ represents the number of bits in each coefficient of each component. For example, assuming there are totally 3 components and each coefficient of a component is 11 bits, for a VGA size, the size of the memory buffer 114 should be about 1.2 Mbytes (Megabytes) (640×480×3×11).

For portable devices like cellular phones, it is unreasonable to allocate 1.2 Mbytes memory for progressive JPEG image decoding. In some embodiments, the Huffman decoder 112 of the present invention applies a multi-run algorithm for reducing the memory usage.

Figure 9:
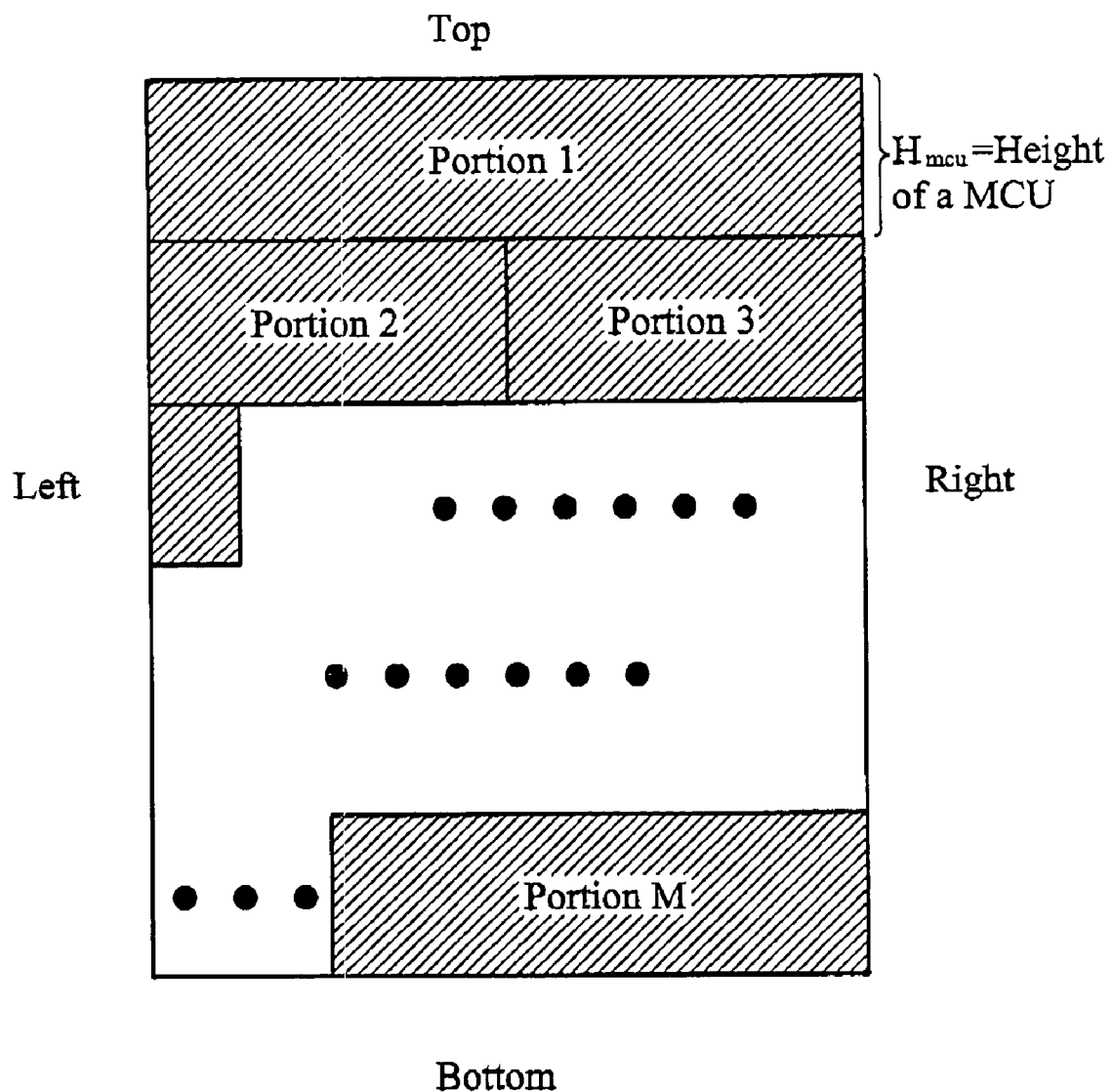
FIG. 9 is a diagram of a JPEG image divided into several consecutive portions in the multi-run algorithm.

In the multi-run algorithm, the JPEG image is divided into several consecutive portions as shown in FIG. 9. In each run, only one portion is processed by the Huffman decoder 112. Since only one portion is processed, the memory buffer 114 only needs to contain the progressive coefficients in that portion and therefore the buffer size in the memory buffer 114 can be greatly reduced. In some embodiments, the size of each portion is set in the unit of MCU (Minimum Coding Unit) by software programs of the APB interface 104. That is, the smallest portion is one MCU. In JPEG specifications, the maximum MCU is composed of ten 8×8 data units and each coefficient takes 2 bytes to store. Therefore, the maximum size of a MCU is 10(data units(×8(width)×8(height)× 2(bytes)=1280 Bytes, which is the minimum coefficient buffer size of the memory buffer 114 for the progressive JPEG decoder to decode progressive JPEG images.

Besides storing the coefficients, the memory buffer 114 also needs to store Huffman/quantization tables. Up to 4 DC Huffman tables, 4 AC Huffman tables and 4 quantization tables are possibly seen in a JPEG file. Since each quantization table is 64 bytes and each pair of DC/AC Huffman table is less than 256 bytes, by the portion dividing multi-run algorithm, the memory buffer 114 only needs 4×(64+256)= 1280 bytes to store all these tables.

In other words, the required size of the memory buffer 114 for progressive coefficients and Huffman/quantization table storage in the progressive JPEG decoder is only 2560 Bytes.

In the multi-run algorithm of the present invention, the process the certain portion of a progressive JPEG image file and bypass the rest, it needs some indexes to identify the starting point and end point of the certain portion. Since the portion is measured in the unit of MCU, in the following embodiment, the starting point and end point will be specified in MCU numbers.

As a scan in progressive JPEG image file may contain all 3 components or only one of the three components, 4 sets of indexes, including intlv_first_mcu and intlv_last_mcu, comp0_first_data_unit and comp0_last_data_unit, comp1_first_mcu and comp1_last_mcu, and comp2_first_mcu and comp2_last_mcu, are defined and programmed by software.

Two kinds of scan orders may be used in decoding data units, interleaved scan and non-interleaved scan. The non-interleaved scan means an image frame is scanned in line by line. That is, the scan moves to the next line only when the scan of the previous line is finished. Conversely. The interleaved scan means an image frame may be scanned from the previous line to next line while the scan of the previous line is not finished. Here, the index of intlv_first_mcu defines the first MCU number to process in an interleaved scan. The index of intlv_last_mcu defines the last MCU number to process in an interleaved scan. The index of comp0_first_data_unt defines the first data unit number to proves in a non-interleaved scan containing component 0 only. The index of comp0_last_data_unit defines the last data unit number to process in a non-interleaved scan containing component 0 only. The index of comp1_first_mcu defines the first dat unit number to process in a non-interleaved scan containing component 1 only. The index of comp1_last_mcu defines the last data unit number to process in a non-interleaved scan containing component 1 only. The index of comp2_first_mcu defines the first data unit number to process in a non-interleaved scan containing component 2 only. The index of comp2_last_mcu defines the last data unit number to process in a non-interleaved scan containing component 2 only. Given the se indexes, the decoder will skip and not process the data stream before the starting indexes (intlv_first_mcu, comp0_first_data_unit, comp1_first_data_unit, comp2_first_data_unit) and after the end indexes (intlv_last_mcu, comp0_last_data_unit, comp1_last_data_unit, comp2_last_data_unit).

Figure 10:
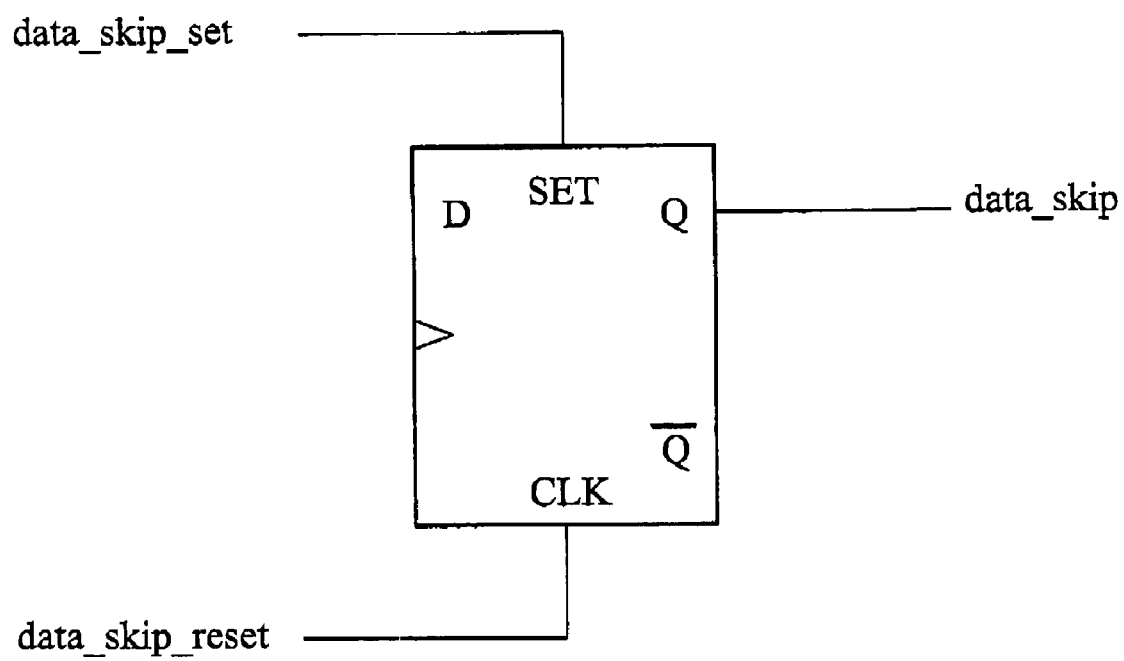
FIG. 10 is a diagram of a hardware-implemented multi-run algorithm controller in a Huffman decoder.

FIG. 10 shows a hardware-implemented multi-run algorithm controller in a Huffman decoder. As shown in FIG. 10, a signal data_skip is generated and input to a Fli-flop device. When the data_skip stays high, the controller will make the Huffman decoder skip the data processing of the current data and not write back the decoded coefficients into the memory buffer 114. If data_skip is low, the Huffman decoder will process data as normal. Data_skip is configured by data_skip_set and data_skip_reset.

FIG. 10 lists the condition for data_skip_set and data_skip_reset to hold true. After the header parsing is done (SOS marker is over), if the starting index if not 0, data_skip_set must go high to skip the first several MCUs until the index counter reaches the starting index. Also, when the index counter reaches the ending index and the current MCU is done, data_skip_set must go active as well to skip the remaining unnecessary data. Similarly, data_skip_reset goes active when the index counter equals to the starting index minus 1 and the current MCU ends, which means the MCU right before the first valid MCU is over. The data_skip_reset signal doesn't have to act when the starting index is set to 0 because the default value of data_skip is 0 upon hardware reset. A starting index of 0 indicates hardware to process the data from the very first MCU in the JPEG image file.

The data_skip controlling scheme is good enough for DC first scan, DC refine scan and AC first scan since in these 3 scan, the Huffman decoding of any DC/AC coefficient doesn't need the amplitude information from coefficients generated in previous scans. However, the AC refine scans, the decoding of AC coefficients relies on the amplitude of AC coefficients generated in previous AC first scans. Due to limited memory usage, some AC coefficients are skipped and the amplitude information will not be available in memory anymore. Without the AC coefficient amplitude information from previous AC first scan, an AC refine scan can't decode the bit stream correctly and therefore the MCU index counter can't count properly.

Figure 11:
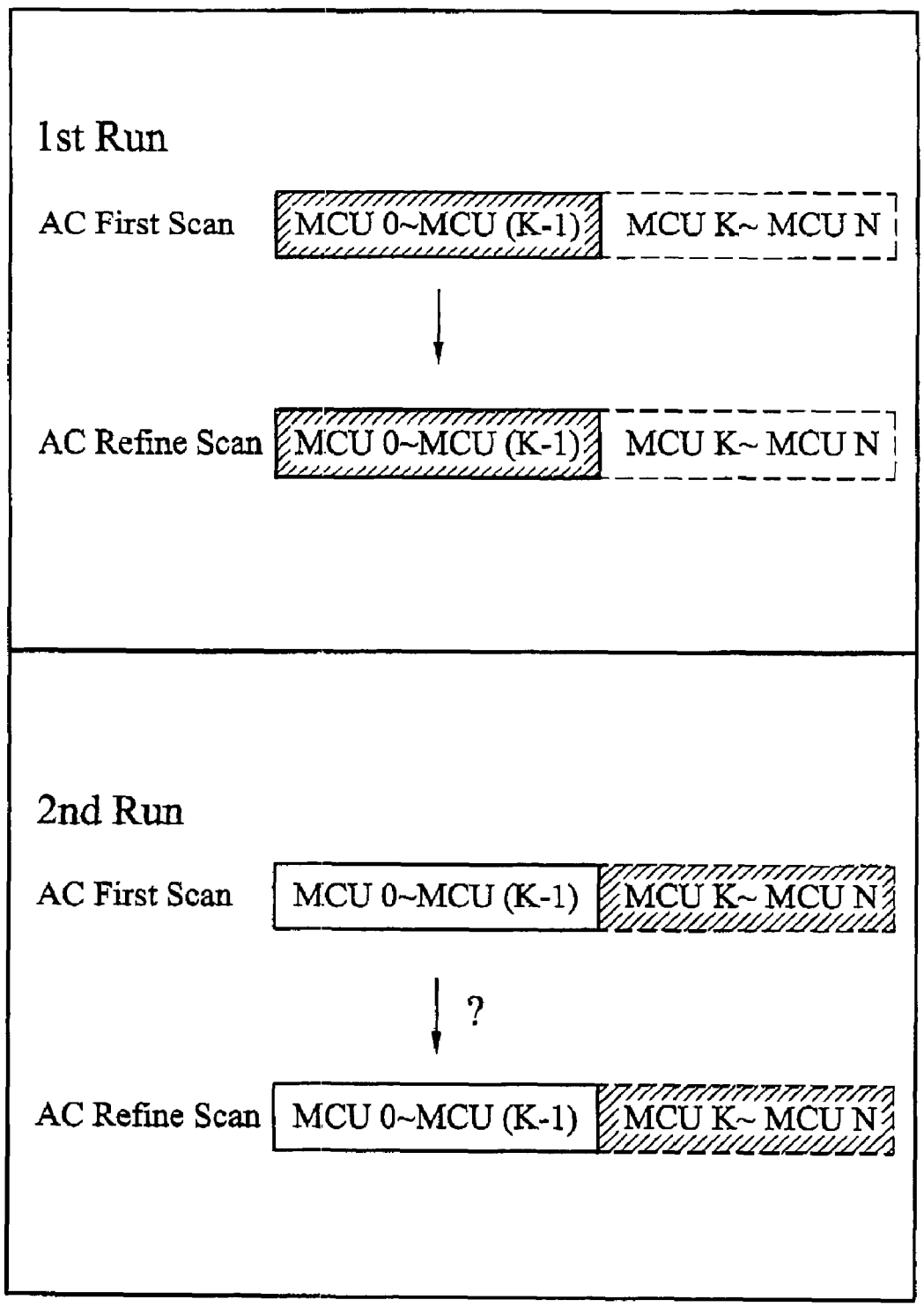
FIG. 11 is a diagram of a graphical interpretation about the problem with AC refine scan in multi-run algorithm.

FIG. 11 gives a graphical interpretation about the problem with AC refine scan in multi-run algorithm. For the $1^{st}$ run, there is no issue at all because the AC coefficients of MCU 0~K in AC first scan are stored in memory and AC refine scan can use them to decode AC coefficients correctly. For the $2^{nd}$ run, the decoder won't know how many data bits are consumed by AC coefficients of MCU 0~K in AC refine scan because no AC coefficients of MCU 0~K in AC first scan are available. Therefore, the decoder does not know where and when to start decoding MCU K.

Figure 12:
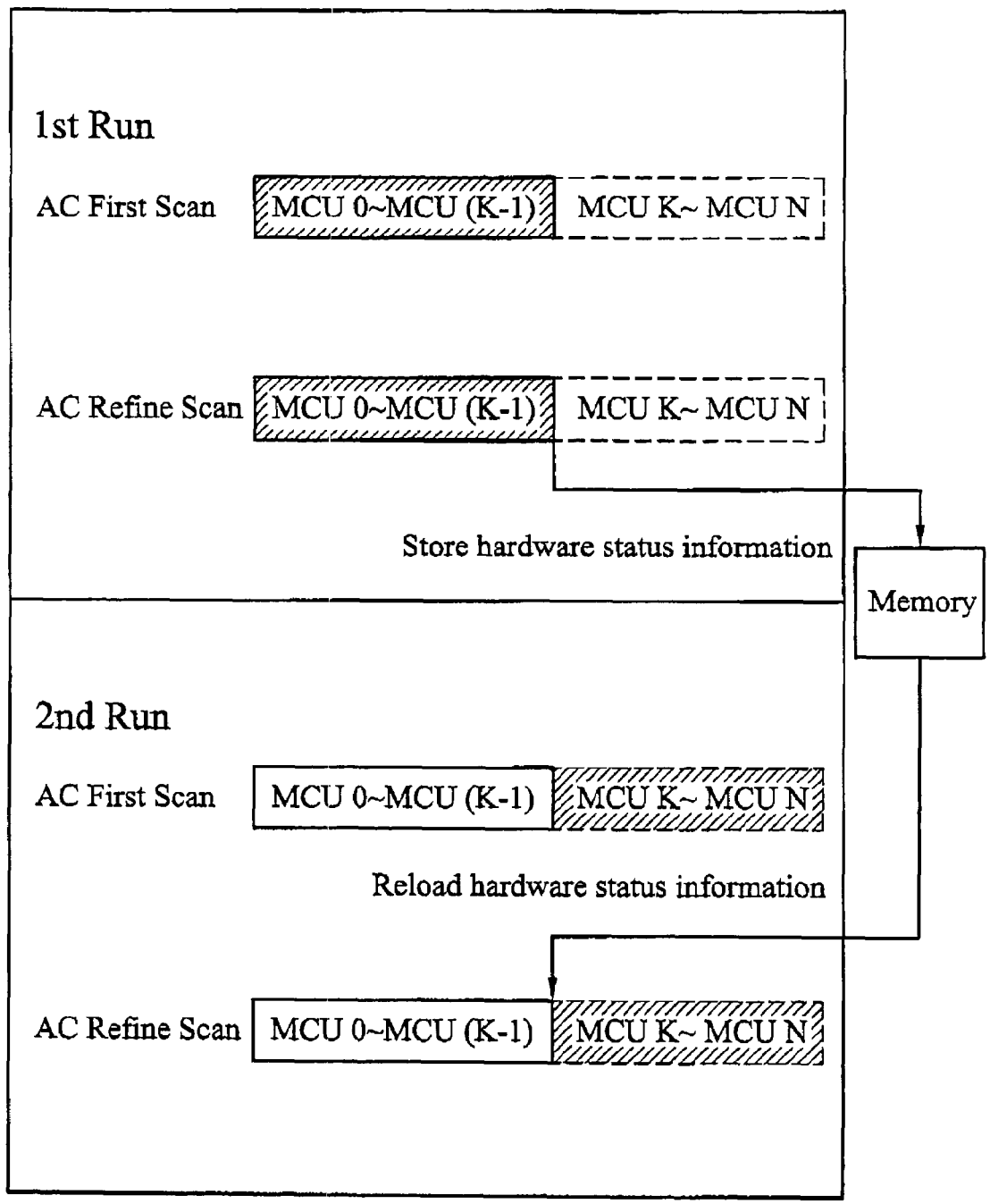
FIG. 12 is a diagram of the trick for AC refine scan in multi-run algorithm.

To solve this problem, the present invention make AC refine scan proceed without AC coefficient amplitude information from previous scans by storing enough hardware control signals and status information into memory at the end of the AC refine scan in the previous run and then reloading these information at the same AC refine scan in the current run. FIG. 12 shows how the reloading works. The hardware control signals and status information stored at the end of each AC refine scan may include the following items:

1. The location in the JPEG decoding image where the current portion of AC refine scan ends.
2. EOB run length after the current portion of AC refine scan is done.
3. Values of miscellaneous hardware control signals.

Figure 2A:
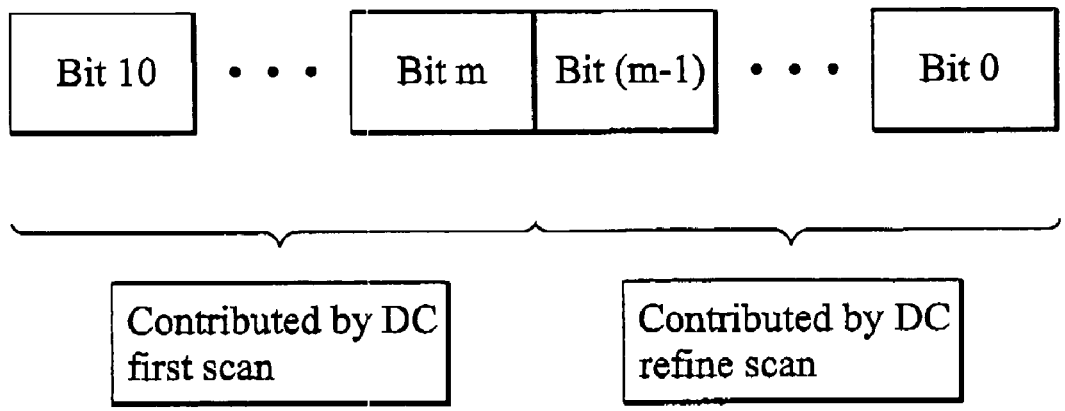
FIG. 2a is a diagram of an exemplary embodiment of a DC coefficient.
Figure 2B:
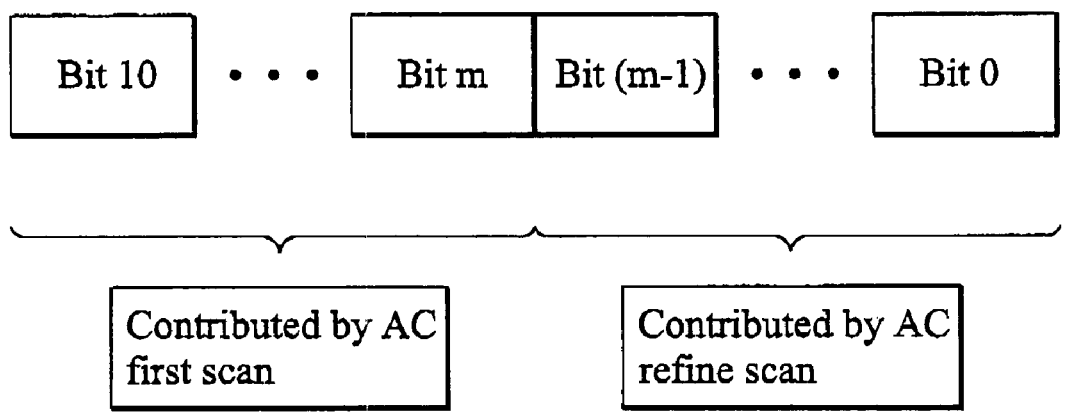
FIG. 2b is a diagram of an exemplary embodiment of an AC coefficient.

FIG. 2a is a diagram of an exemplary embodiment of a DC coefficient. As shown in FIG. 2a, if a DC coefficient is 11 bits in length, bit 0 to bit (m−1) may be contributed by DC refine scan and bit m to bit 10 by DC first scan. FIG. 2b is a diagram of an exemplary embodiment of an AC coefficient. As shown in FIG. 2b, if an AC coefficient is 11 bits, bit 0 to bit (n−1) may be contributed by AC refine scan and bit n to bit 10 by AC first scan. Here, MSBs and LSBs (least significant bits) of DC/AC coefficients may be located in different positions in different scans. The variables m and n can be different for Y, U, and V components of an image frame. Scanning, such as a DC first scan, DC refine scan, AC first scan or AC refine scan, may generate one, two, or three components. A Huffman decoder is required to decode Huffman-encoded data all types of scanning data.

For brevity, the following state diagrams illustrate functions of the Huffman decoder of the present invention for decoding DC/AC coefficients, which is not a limitation to the present invention. As shown in those state diagrams, there are totally several states in the Huffman decoder state machine to support both Huffman decoding algorithm and multi-run algorithm, including IDLE state, COEFF_READ state, COEFF_WRITE state, HOFF_ADDR_LOG state, HUFF_ADDR_PHY state, and AMP_CAL state.

The IDLE state is the initial state. In the COEFF_READ state, the progressive coefficient is read back from memory for update. In HUFF_ADDR_LOG state, after figuring out logical and physical address of the codeword which Huffman code refers to, it moves to HUFF_ADDR_PHY state to read back the codeword. In HUFF_DEC_PHY state, a memory read is performed to read back the codeword that Huffman code refers to.

In EOB_RUN_GEN state, the main task is to determine eob_run and zero_run. Note that if the run/size is representing an EOB run length, the value of eob_run is to append some raw data bits from the barrel shifter to a single bit '1'. The number of the appending raw data bits is "run". If the run/size is a zero-run length, just make zero_run equal to "run". The AMP_CAL state is to calculate the non-zero coefficient amplitude based on "size" and the raw data bits from barrel shift register (return_data[15:0]). In COEFF_WRITE state, the refined coefficients are written back into memory buffer.

Figure 3A:
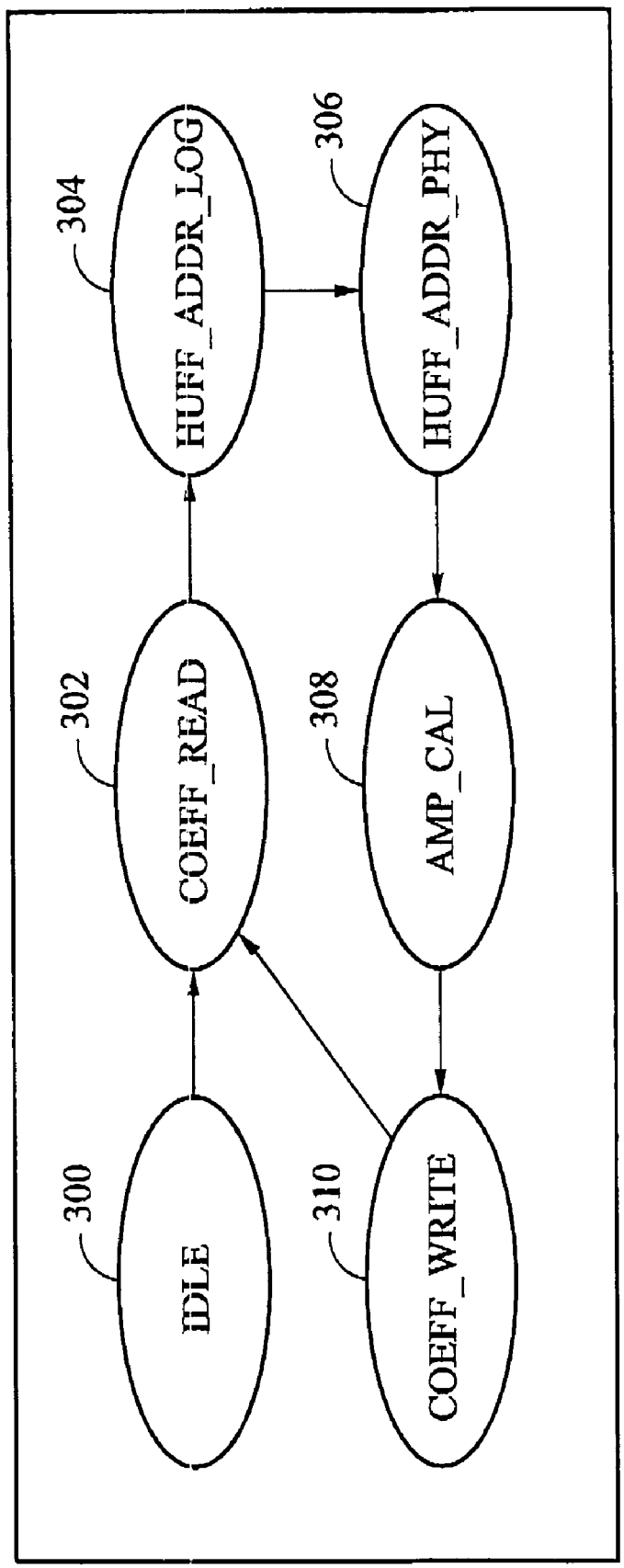
FIG. 3a is a diagram of an exemplary embodiment of a state machine diagram of a DC first scan.

FIG. 3a is a diagram of an exemplary embodiment of a state machine diagram of a DC first scan. In the DC first scan decoding process. DC coefficients are sent to memory storage for further DC refine scans. Here, because a data access length in a JPEG decoder is generally 32 bits, which contain two 11-bit coefficients, although no decoded coefficient of a DC first scan is required to be read for updating, the state machine may revert from the IDLE state 300 to COEFF_READ state 302.

Thereafter, the state machine transfers directly to the Huffman decoding states, i.e. HUFF_ADDR_LOG 304 and HUFF_ADDR_PHY 306.

Due to the marker parser storing Huffman tables in different memory addresses allocated by software, the HUFF_ADDR_LOG state 304 generates logical addresses of data encoded in Huffman code. Physical addresses are calculated in HUFF_ADDR_PHY state 306. The state machine may further trigger a read to memory based on the calculated physical address. The logic states transfer to AMP_CAL state 308 to compute DC coefficients after the run/length is obtained. The DC coefficients are stored to memory storage based on the physical address provided by a progressive address generator in COEFF_WRITE STATE 310. The stored DC coefficients are used for further DC refine scans.

Figure 3B:
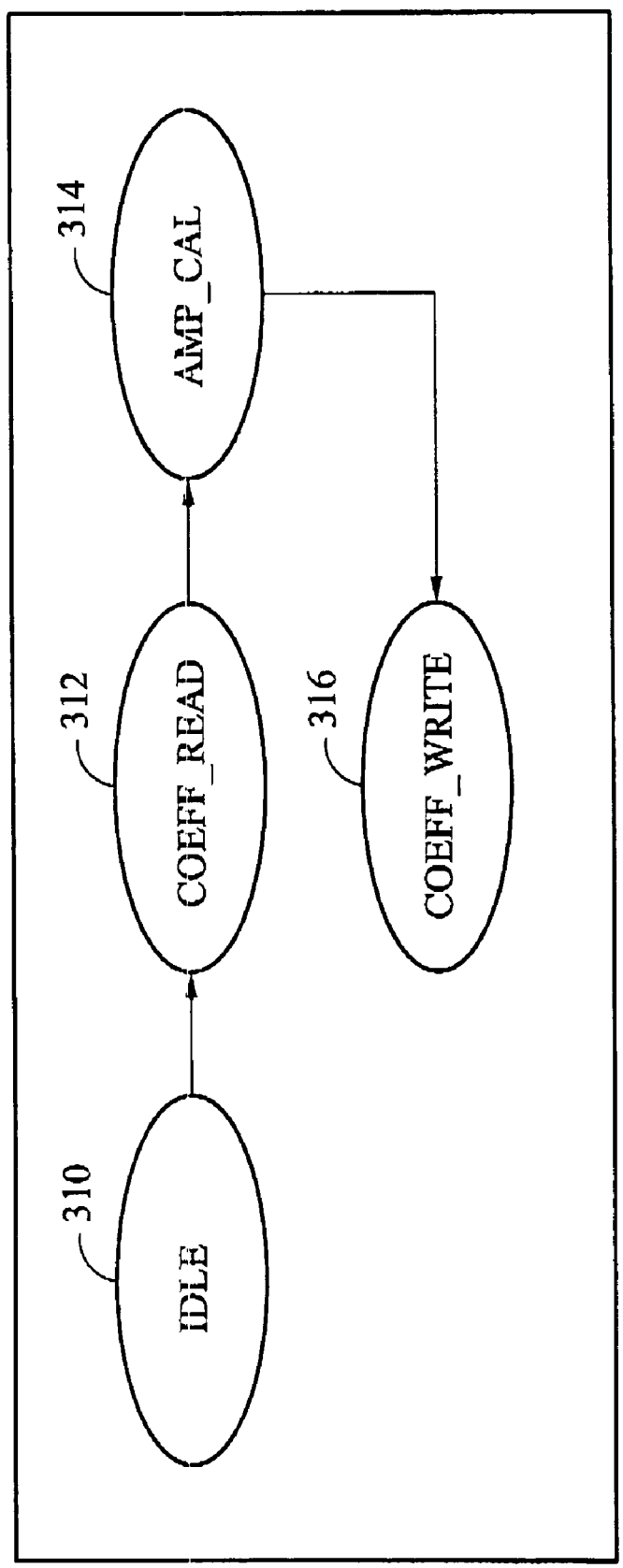
FIG. 3b is a diagram of an exemplary embodiment of a state machine diagram of a DC refine scan.

FIG. 3b is a diagram of an exemplary embodiment of a state diagram of a DC refine scan. A DC refine scan is easily processed because only raw data bits are contained therein. Each DC refine scan updates one bit according to the previous decoded DC coefficients. The state machine transfers from IDLE state 310 to COEFF_READ state 312 to read the DC decoded coefficients produced by previous DC first scans or DC refine scans. Because the DC refine scan includes only raw data, Huffman decoding is not required. The state machine transfers to AMP_CAL state 314 to extract the raw data bits to update the current DC coefficients. The DC coefficients are stored to memory storage as the read address in COEFF_WRITE state 316 after updating.

Figure 3C:
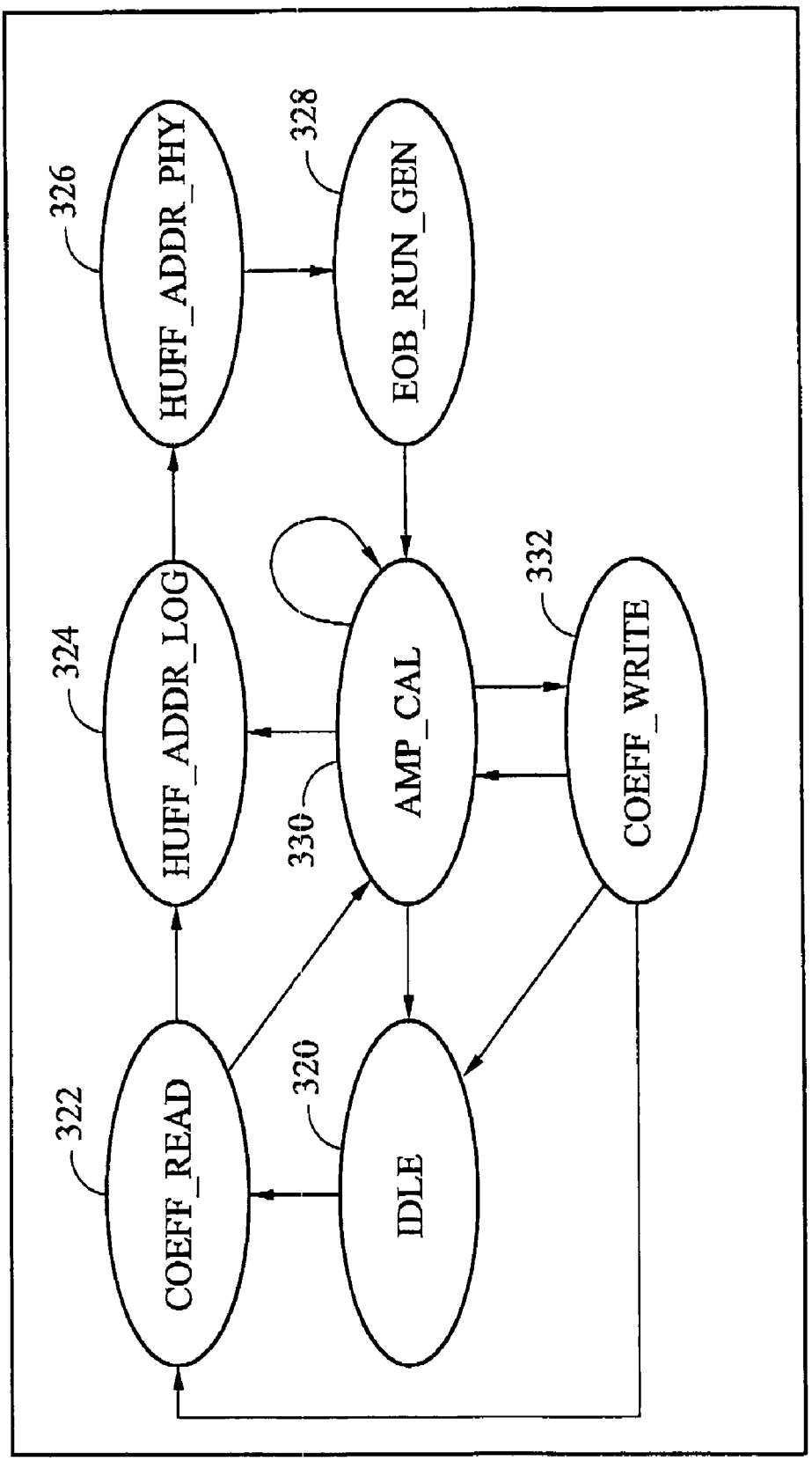
FIG. 3c is a diagram of an exemplary embodiment of a state machine diagram of an AC first scan.

FIG. 3c is a diagram of an exemplary embodiment of a state diagram of an AC first scan. An AC first scan is similar to DC first scan except that an AC first scan may include zero run and EOB (End of Block) run. Zero run is generated by zero run length coding indicating the number of zeros before the next non-zero coefficient in a current 8×8 data block. Consequently, the zero run can be treated as length of zeros. Similarly, EOB run is the length of EOB. An EOB in an AC first scan means all AC coefficients in the current 8×8 data block are zero. If EOB runs is three, the next three 8×8 data blocks do not generate non-zero AC coefficients.

FIG. 3c is a diagram of an exemplary embodiment of a state machine diagram of an AC first scan. The state machine transfers from IDLE state 320 to COEFF_READ state 322. The COEFF_READ state 322 disrupts the previously decoded coefficients. Zero run and EOB run are checked to determine the next state, i.e. HUFF_ADDR_LOG state 324 or AMP_CAL state 330. If zero run or EOB run carries a positive value, next non-zero AC coefficient is recognized as unreached. Thus, the next state is AMP_CAL state 330.

Otherwise, if both zero run and EOB run are zeros, the current AC coefficient is non-zero and the value is to be determined. The state transition goes through HUFF_ADDR_LOG 324 and HUFF_ADDR_PHY 326 states to acquire run/length information bits from AC Huffman tables in memory storage. if the run/length indicates that the EOB run is not zero, the hardware stores this EOB run length and sets AC coefficients in following several blocks as zeros. The state machine transfers the AMP_CAL state 330 for setting the AC coefficient to a zero or non-zero value whatever the EOB run is zero or not.

In AMP_CAL state 330, the state machine may transfer to three possible states. Each memory access, that is, data read/write, of progressive coefficient buffer affects two coefficients. The first is even-indexed as coefficient 2k and the second is odd-indexed as coefficient (2k+1).

If coefficient 2k is processed and the zero run or EOB run is recognized as non-zero, the state stays in AMP_CAL state 330. If coefficient (2k+1) is processed and the zero run or EOB run is recognized as non-zero, the state transfers to COEFF_WRITE state 332 to write coefficients 2k and (2k+1) back into a progressive coefficient buffer.

If coefficient (2k+1) is processed and both zero run and EOB run are recognized as zeros, the state also transfers to COEFF_WRITE state 332 to write coefficients 2k and (2k+1). If coefficient 2k is processed and both zero run and EOB are recognized as zeros, the state transfers to HUFF_ADDR_LOG state 324 to obtain next run/length information bits to determine the value of coefficient (2k+1).

In COEFF_WRITE state 332, if the zero run or EOB run is still not zero and the current data unit is still processing, the state transfers back to AMP_CAL state 330 since the next AC coefficient is definitely zero. If the current data unit processing is finished, the state transfers to IDLE state 320 for next data unit processing. If both zero run and EOB run are zeros and the current data unit processing is not finished, the state proceeds to COEFF_READ state 322.

If state transfers to IDLE state 320, EOB run is checked if it is zero. If EOB run is not zero, no Huffman decoding is necessary and the state transfers to AMP_CAL state 330 directly. Otherwise, the state transfers to COEFF_READ state 322 for Huffman decoding.

Figure 3D:
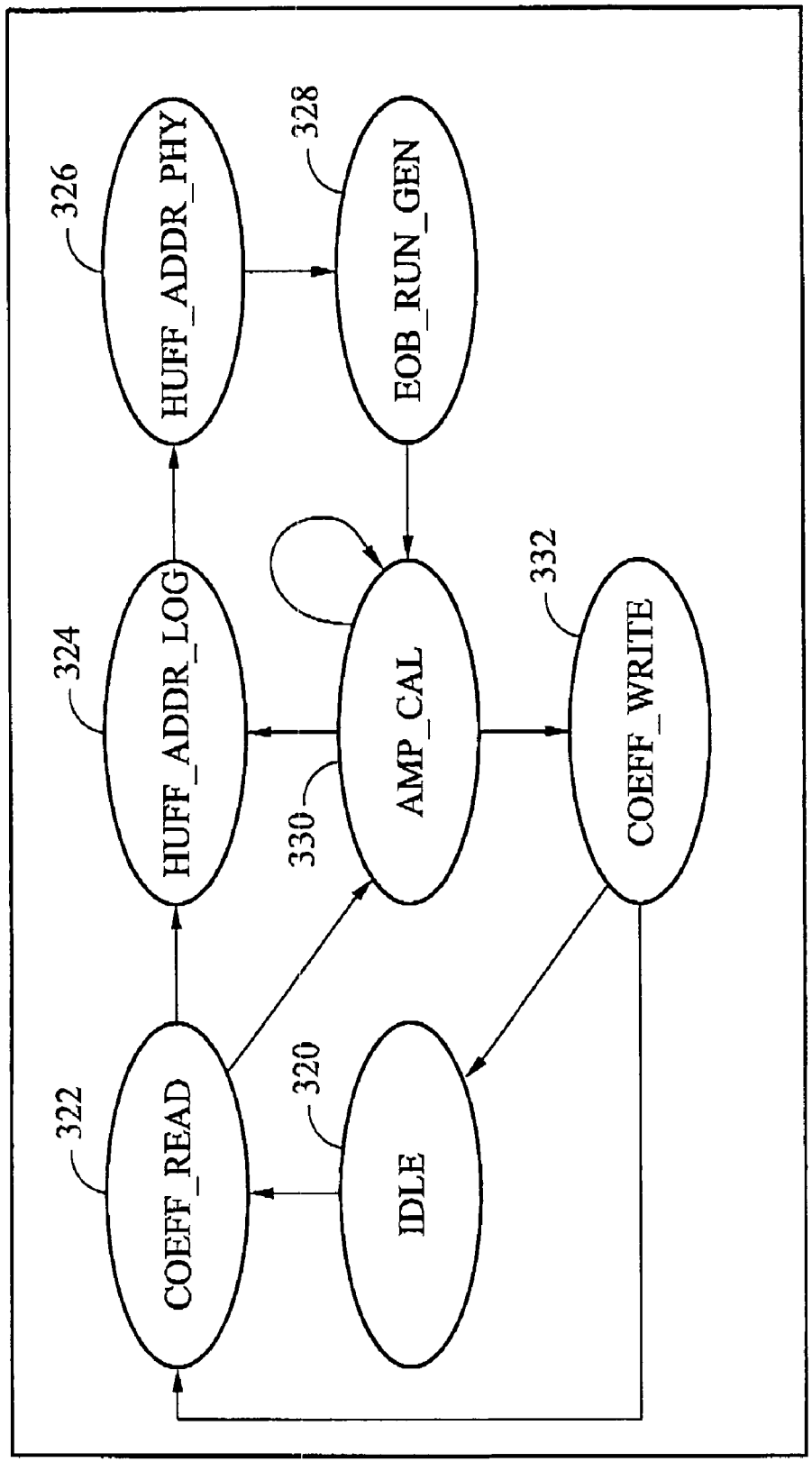
FIG. 3d is a diagram of an exemplary embodiment of a state machine diagram of an AC refine scan.

FIG. 3d is a diagram of an exemplary embodiment of a state diagram of an AC refine scan. The state machine transition in AC refine scan is similar to AC first scan. The difference is that the state does not transfer to AMP_CAL state 330 from COEFF_WRITE state 332 because AC refine scan checks every AC coefficient even when the zero run or EOB run is not zero.

Based on the disclosed scan framework, hardware-implemented Huffman decoders using logic gates to implement logic states are provided. The logic states include IDLE, COEFF_READ, COEFF_WRITE, HUFF_ADDR_LOG, HUFF_ADDR_PHY, AM_CAL, and EOB_RUN_GEN.

Figure 4A:
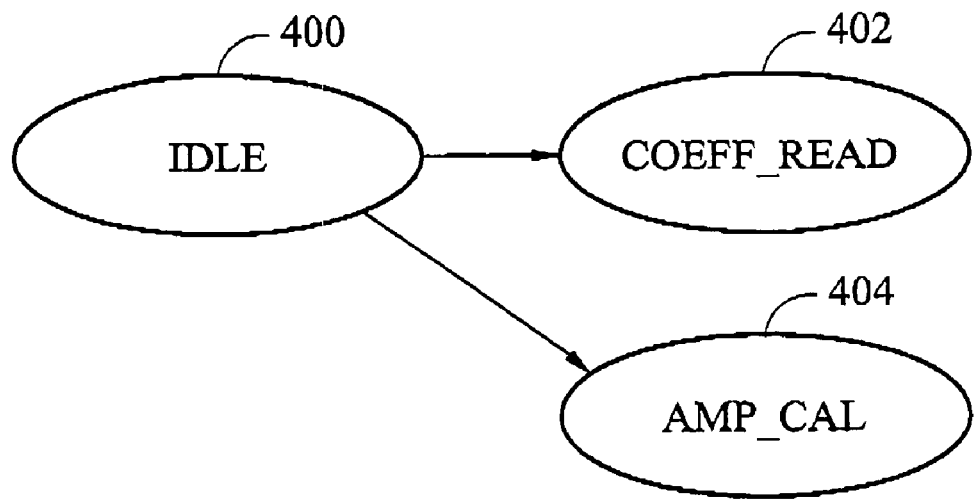
FIGS. 4a-4g are diagrams of exemplary embodiments of detailed hardware states for state machine diagrams.
Figure 4B:
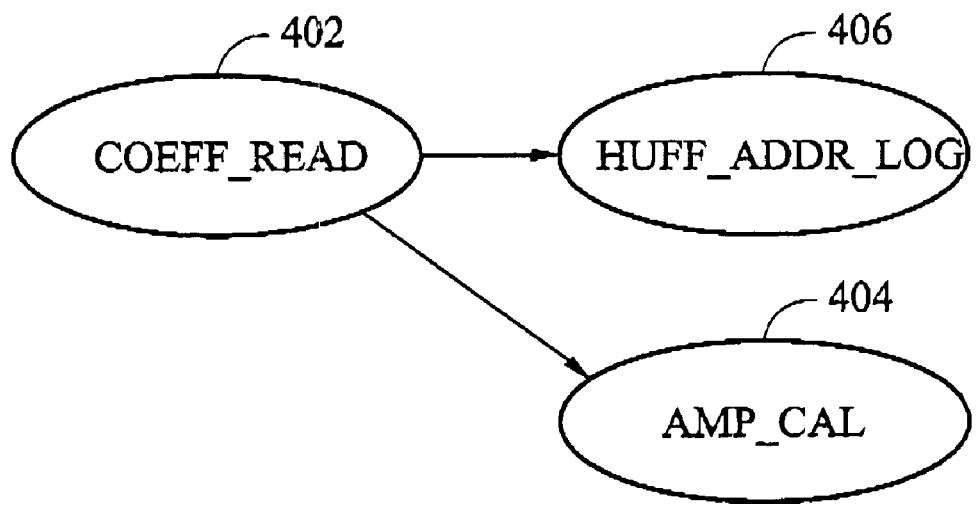
Figure 4C:
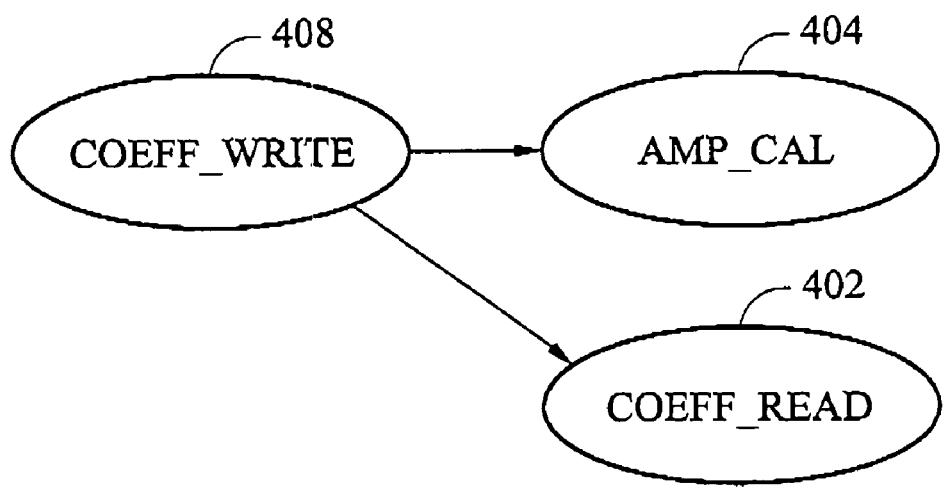

FIGS. 4a-4g are diagrams of exemplary embodiments of detailed hardware states for state machine diagrams. IDLE state 400 transfers to COEFF_READ state 402 or AMP_CAL state 404 according to eob_run, ac_first_scan, and ss signals as shown in FIG. 4a. COEFF_READ state 402 transfers to HUFF_ADDR_LOG state 406 or AMP_CAL state 404 according to ac_first_scan, ac_refine_scan, eob_run, new_ac_nonzero_coeff, and dc_refine_scan signals as shown in FIG. 4b. COEFF_WRITE state 408 transfers to AMP_CAL state 402 or COEFF_READ state 404 according to ac_first_scan, coeff_index, zero_run, and eob_run signals as shown in FIG. 4c.

Figure 4D:
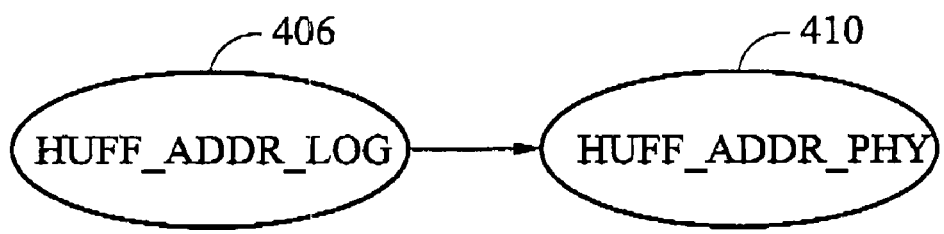
Figure 4E:
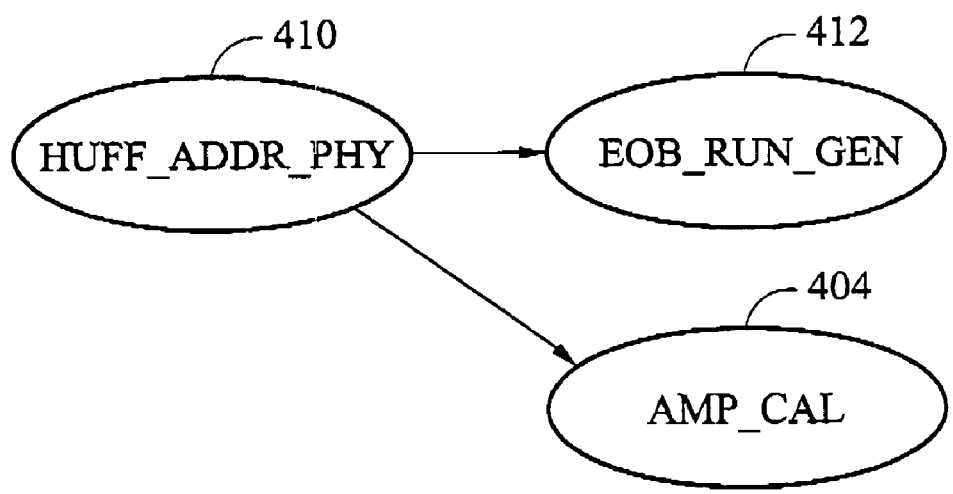
Figure 4F:
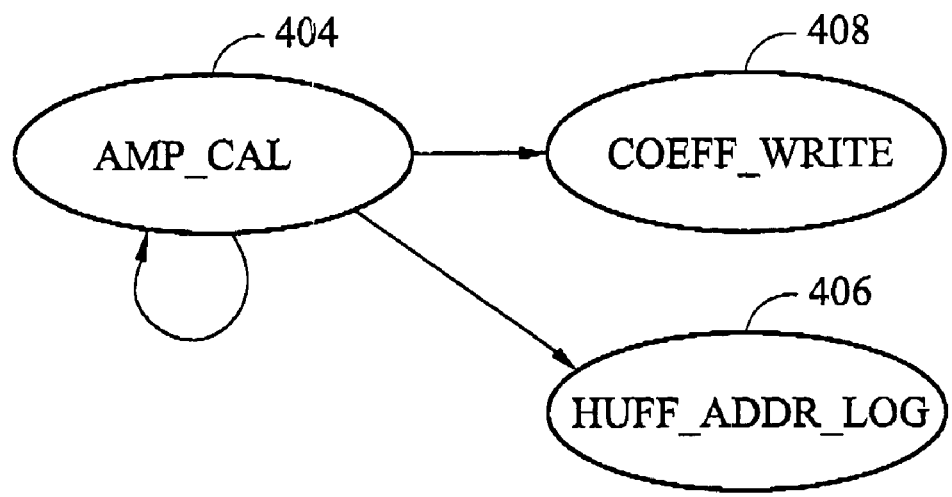
Figure 4G:
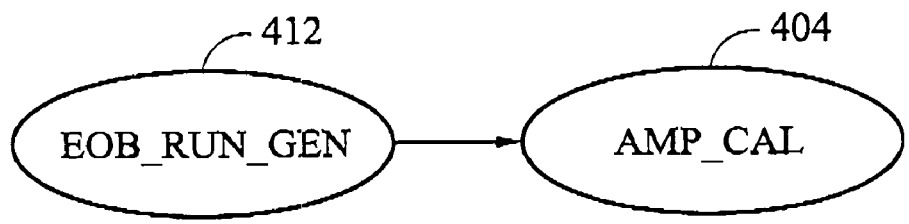

HUFF_ADDR_LOG state 406 transfers to HUFF_ADDR_PHY state 410 as shown in FIG. 4d. HUFF_ADDR_PHY state transfer to AMP_CAL state 404 or EOB_RUN_GEN state 412 according to ac_first_scan and ac_refine_scan signals as shown in FIG. 4e. AMP_CAL state 412 transfer to AMP_CAL state 404, COEFF_WRITE state 408, or HUFF_ADDR_LOG state 406 according to dc_first_scan, dc_refine_scan, ac_first_scan, ac_refine_scan, coeff_index, zero_run, eob_run, new_ac_nonzero_coeff, se, and progr_coeff0_pool signals as shown in FIG. 4f. EOB_RUN_GEN state 412 transfers to AMP_CAL state 404 as shown in FIG. 4g.

Here, the ss and se signals indicate start and end coefficients in the current scan and are generated by a maker parser coupled to the Huffman decoder. The ac_first_scan, ac_refine_scan, dc_first_scan, and dc_refine_scan signals identifying the current scan as an AC first scan, an AC refine scan, a DC first scan, or a DC refine scan, are generated by a JPEG decoder controller coupled to the Huffman decoder. The coeff_index signal, indicating an index of coefficients of the current scan, is also generated by the JPEG decoder controller. The eob_run, zero_run, new_ac_nonzero_coeff, and the progr_coeffe0_pool signals indicating EOB run length, zero run length, non-zero EOB run length, and a current coefficient with even index, are generated by the Huffman decoder.

Figure 5:
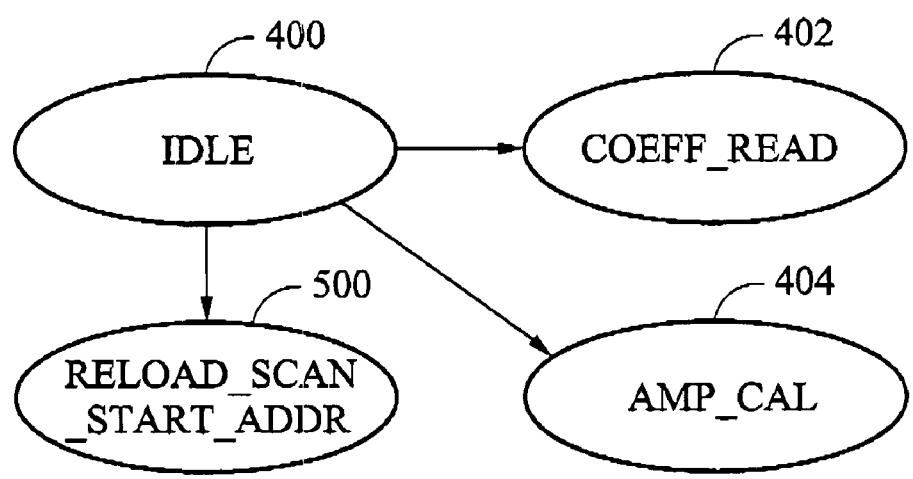
FIG. 5 is a diagram of an exemplary embodiment of a state diagram of IDLE state.

FIG. 5 is a diagram of an exemplary embodiment of state diagram of IDLE state. Referring to FIG. 5 along with FIG. 4a, the IDLE state 400 further transfers to RELOAD_SCAN_START_ADDR state 500 according to the ac_refine_scan and a data_skip signals. The data_skip signal indicates whether the logic state transfers from the IDLE state to the RELOAD_SCAN_START_ADDR state.

Figure 6A:
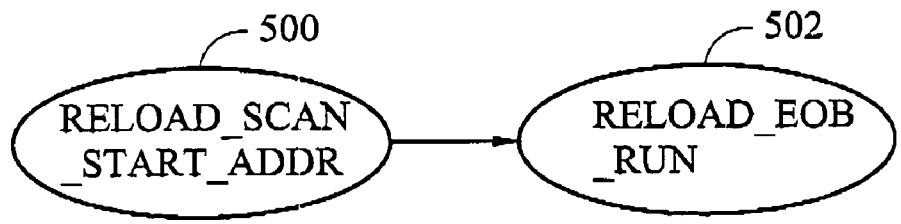
FIGS. 6a-6d are diagrams of exemplary embodiments of detailed state diagrams.
Figure 6B:
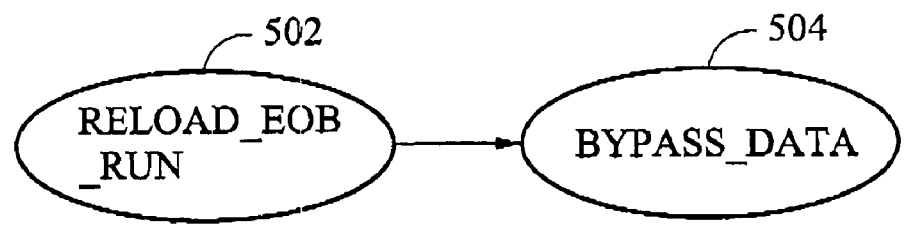
Figure 6C:
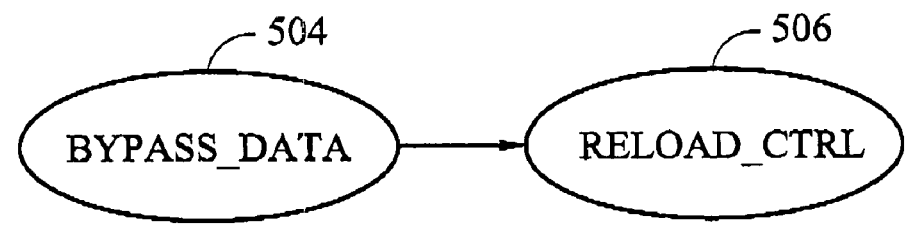
Figure 6D:
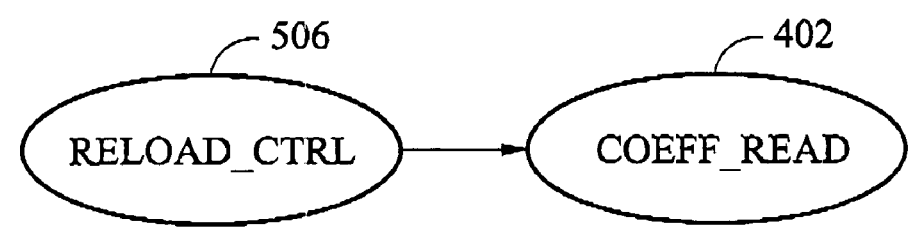

The RELOAD_SCAN_START_ADDR state transfers to RELOAD_EOB_RUN state 502 as shown in FIG. 6a. The RELOAD_EOB_RUN state 502 transfers to BYPASS_DATA state 504 as shown in FIG. 6b. The BYPASS_DATA state 504 transfers to RELOAD_CTRL state 506 as shown in FIG. 6c. The RELOAD_CTRL state 506 transfer to the COEFF_READ state 402.

Figure 7:
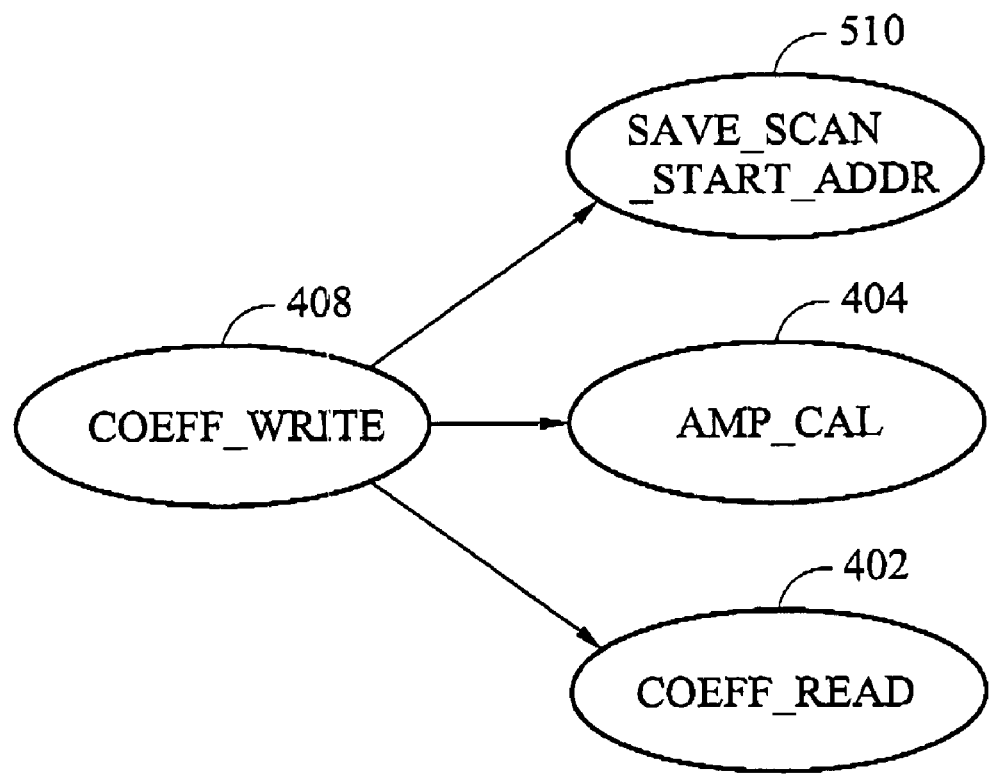
FIG. 7 is a diagram of an exemplary embodiment of a state diagram of COEFF_WRITE state.

FIG. 7 is a diagram of an exemplary embodiment of state diagram of COEFF_WRITE state. Referring to FIG. 7 along with FIG. 4c, the COEFF_WRITE state 408 further transfers to SAVE_SCAN_START_ADDR state 510 according to the ac_refine_scan, a scan_done, and a mcu_skip_set signals. Here, the scan_done and the mcu_skip_set signals indicate the termination of a current scan and disregarding of a MCU.

Figure 8A:
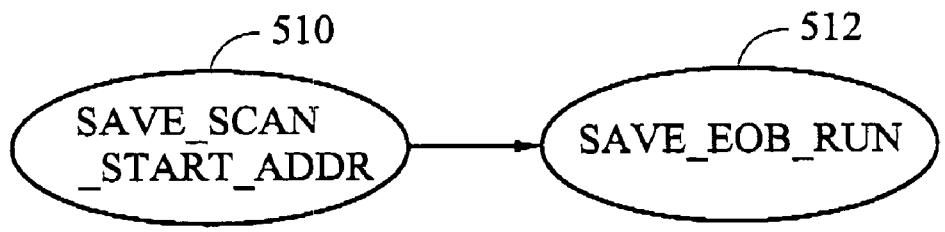
FIGS. 8a-8c are diagrams of exemplary embodiments of detailed state diagrams.
Figure 8B:
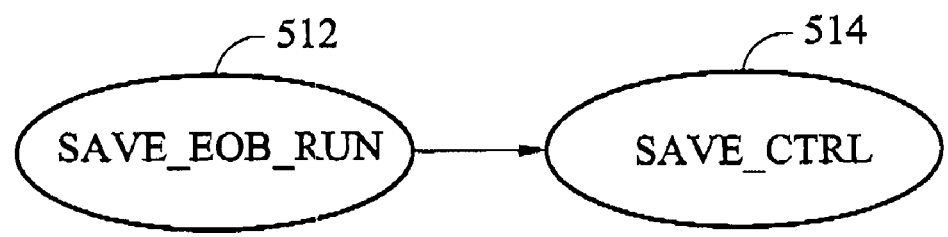
Figure 8C:
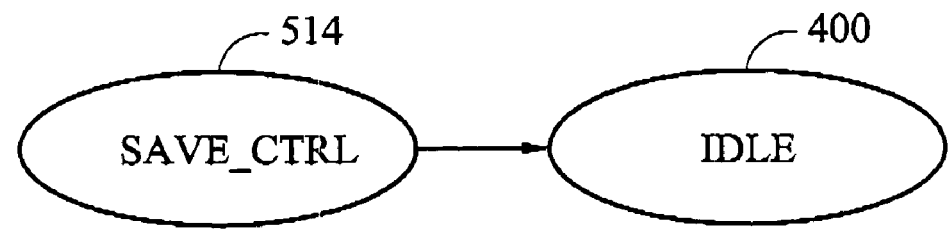

The SAVE_SCAN_START_ADDR state 510 transfers to SAVE_EOB_RUN state 512 as shown in FIG. 8a. The SAVE_EOB_RUN state 512 transfers to SAVE_CTRL state 514 as shown in FIG. 8b. The SAVE_CTRL state 514 transfers to the IDLE state 400.

As disclosed, a hardware-implemented Huffman decoder increases decoding speed. Furthermore, the hardware-implemented Huffman decoder reduces switching between software and hardware for image decoding.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A JPEG decoder, comprising:
a barrel shift register receiving and transmitting one portion of a JPEF file comprising at least one of frame header or/and image data to a marker parser or a Huffman decoder;
the marker parser receiving the portion of the JPEG file to decode a header information thereof;
a JPEG decoder controller receiving a control signal from the marker parser to enable the Huffman decoder;
a memory buffer storing progressive coefficients;
the Huffman decoder receiving and converting the progressive coefficients to logic addresses, decoding the portion of the JPEG file which does not comprises the header information;
a progressive address generator receiving and converting the logic addresses to physical addresses; and
an inverse discrete cosine transform unit performing an inverse discrete cosine transform on received row data to output a JPEG picture.

2. The decoder as claimed in claim 1, further comprising a dma buffer storing and transmitting the portions of JPEG file to the barrel shift register.

3. The decoder as claimed in claim 1, further comprising an APB interface storing variables used for data decoding.

4. The decoder as claimed in claim 3, wherein the variables comprises an start address and an end address of each portion of the JPEG file.

5. The decoder as claimed in claim 1, wherein the memory buffer further stores Huffman/quantization tables.

6. The decoder as claimed in claim 1, wherein the Huffman decoder further converts the decoded portion of the JPEG file which does not comprise the header information into the row data.

7. The decoder as claimed in claim 1, wherein the JPEG file comprises three layers, and the Huffman decoder performs one first scan and two refine scan respectively on the three layers.

8. The decoder as claimed in claim 7, wherein values of pixels of the JPEG picture is determined based on the processing results of the first scan and the refine scan.

9. The decoder as claimed in claim 1, wherein the size of the memory buffer is 2560 bytes.

10. The decoder as claimed in claim 1, wherein the size of each portion of the JPEF file 1280 bytes.

11. The decoder as claimed in claim 1, wherein when the Huffman decoder detects that the image data is 0, the Huffman decoder skips processing and transmitting a stop signal to stop the operating of the inverse discrete cosine transform unit.

12. The decoder as claimed in claim 11, wherein when the Huffman decoder detects that the image data is not 0, the Huffman decoder begins processing and transmitting a start signal to enable the operating of the inverse discrete cosine transform unit.

13. A JPEG decoding method, comprising:
transmitting a portion of a JPEG file to marker parser to decode a header information thereof;
transmitting the portion of the JPEG file to a Huffman decoder to decode an image data thereof when the decoding of the header information is finished;
receiving and converting progressive coefficients to logic addresses by the Huffman decoder;
receiving and converting the to physical addresses by a progressive address generator; and
performing an inverse discrete cosine transform on the decoded data from the Huffman decoder to output a JPEG picture.

14. The method as claimed in claim 13, further comprising when the Huffman decoder detects that the image data is 0, the Huffman decoder skips processing and transmitting a stop signal to stop the operating of the inverse discrete cosine transform unit.

15. The method as claimed in claim 13, further comprising when the Huffman decoder detects that the image data is not 0, the Huffman decoder begins processing and transmitting a start signal to enable the operating of the inverse discrete cosine transform unit.

16. The method as claimed in claim 13, further comprising providing a memory buffer storing the progressive coefficients and Huffman/quantization tables.

17. The method as claimed in claim 16, wherein the size of the memory buffer is 2560 bytes.

18. The method as claimed in claim 13, wherein the size of each portion of the JPEF file 1280 bytes.

19. The method as claimed in claim 13, further comprising converting the decoded portion of the JPEG file which does not comprise the header information into the row data by the Huffman decoder.

* * * * *